United States Patent [19]
Konuma

[11] Patent Number: 5,814,873
[45] Date of Patent: Sep. 29, 1998

[54] SCHOTTKY BARRIER INFRARED SENSOR

[75] Inventor: Kazuo Konuma, Tokyo, Japan

[73] Assignee: NEC Corporation, Tokyo, Japan

[21] Appl. No.: 916,158

[22] Filed: Sep. 2, 1997

Related U.S. Application Data

[63] Continuation of Ser. No. 699,821, Jun. 26, 1996, abandoned, which is a continuation of Ser. No. 498,130, Jul. 5, 1995, abandoned.

[30]     Foreign Application Priority Data

Jul. 5, 1994  [JP]  Japan ..................................... 6-175956

[51] Int. Cl.⁶ ......................... H01L 31/00; H01L 27/295;
                                        H01L 29/812; H01L 31/07
[52] U.S. Cl. ......................... 257/449; 257/450; 257/475
[58] Field of Search .................................. 257/449, 450,
                                                      257/475, 484

[56]             References Cited

FOREIGN PATENT DOCUMENTS 0296371  12/1988  European Pat. Off. .
        0359207   3/1990  European Pat. Off. .
       63-237583 10/1988  Japan .
        4-111467  4/1992  Japan .
        5-90630   4/1993  Japan .
        5335550  12/1993  Japan .

OTHER PUBLICATIONS

Tohyoma, "Silicon HomoJunction IR Detect. . ."IEEE Trans on E D, vol. 41, #9, Sep. 1994, pp. 1535–1540.

Hammam Elabd and Walter F. Kosonocky, "Theory and . . . Schottky–Barrier Detectors With Optical Cavity", *RCA Review*, vol. 43, Dec. 1982, pp. 569–589.

*Primary Examiner*—Stephen Meier
*Attorney, Agent, or Firm*—Sughrue, Mion, Zinn, Macpeak & Seas, PLLC

[57]              ABSTRACT

A solid-state infrared sensor using a Schottky barrier diode. The sensor has a first layer of a semiconductor of a first conductivity type and a second layer of a metal or a metal silicide and the first and second layer are joined to each other to form the Schottky barrier diode. Further, the sensor includes a third layer disposed in the depletion layer formed in the first layer out of contact with the Schottky junction interface. The third layer contains an impurity which is introduced for positioning an effective barrier formed in the depletion layer under an image force, closely to the junction interface. Intensity of an infrared radiation is detected using a multiple reflection effect of hot carriers. According to the infrared sensor, since the position of the effective barrier generated by an influence of a image force is close to the Schottky junction, the attenuation of the energy of the hot carriers is suppressed and the injection yield of the hot carriers passing through the Schottky barrier is increased.

13 Claims, 3 Drawing Sheets

SCHOTTKY BARRIER INFRARED SENSOR

This is a Continuation of application Ser. No. 08/669,821 filed on Jun. 26, 1996 now abandoned, which is a continuation of prior application Ser. No. 08/498,130 filed Jul. 5, 1995 now abandoned.

BACKGROUND OF THE INVENTION

1. Field of the Invention

The present invention relates to a Schottky barrier infrared sensor or a Schottky barrier infrared detector.

2. Description of the Prior Art

Rapid advances in the research and development of Schottky barrier infrared detectors have been experienced in the art since the proposal and practical application of such a Schottky barrier infrared detector by W. Kosonocky et al. of RCA laboratories in U.S.A. (Hammam Elabd and Walter F. Kosonocky, RCA Review, Vol. 43, pages 569–589, December 1982). Recent years have seen the development of several Schottky barrier infrared image sensors having a practical level of pixel numbers. The Schottky barrier infrared sensor proposed by W. Kosonocky et al. comprises a Schottky barrier diode of platinum silicide (PtSi) and p-type silicon doped with boron at a concentration ranging from $10^{14}$ to $10^{15}$ $cm^2$, and employs the photoelectric conversion of the Schottky barrier diode for its operation principles. It is known that the photoelectric conversion of the Schottky barrier infrared sensor can be increased by reducing the thickness of the PtSi layer to a level of several nanometers (nm), based on the multiple reflection effect of hot holes that are generated by the photoelectric conversion.

Japanese Patent laid-open patent No. Sho-63-237583 (JP, A, 63-237583) of S. Toyama discloses an infrared sensor composed of a degenerated semiconductor and a nondegenerated semiconductor which are joined to each other for increasing the life of hot carriers to increase the efficiency and allowing an optimum design of cut-off wavelengths. The degenerated semiconductor layer is used to absorb the infrared radiation to generate hot carriers, as with the metal film of a Schottky barrier infrared sensor. The nondegenerated semiconductor is composed of a potential barrier region substantially corresponding to a region where a depletion layer is formed and a carrier injection region into which carriers are injected from the degenerated semiconductor, with the potential barrier region and the degenerated semiconductor layer being directly contacted to each other.

Schottky barrier infrared sensors are grouped into front-irradiated Schottky barrier infrared sensors and back-irradiated Schottky barrier infrared sensors that are classified according to the surface to which the infrared radiation is applied. FIG. 1 of the accompanying drawings shows a conventional back-irradiated Schottky barrier infrared sensor. As shown in FIG. 1, a p-type silicon (Si) substrate 2 has opposite surfaces ground to a mirror finish, one of the surfaces serving as a surface to which an infrared radiation 13 is applied and which is coated with an anti-reflection film 14 over its entire area. On the other surface of the Si substrate 2, there is deposited a PtSi film 1 in the form of a circular island having a thickness t. The Si substrate 2 and the PtSi film 1 jointly make up a Schottky barrier diode. The infrared radiation applied to the Schottky barrier diode from the side of the Si substrate 2 is absorbed by the PtSi film 1, which generates hot carriers for thereby detecting the applied infrared radiation.

An $n^-$ guard ring 16 is formed in the p-type Si substrate 2 in surrounding relation to the PtSi film 1 for lessening an electric field concentration to suppress a leak current. The $n^-$ guard ring 16 extends from the surface of the p-type Si substrate 2 to a certain depth therein. The surface of the Si substrate 2 around the PtSi film 1 is covered with a thermal oxidization film 17 of $SiO_2$ which is also effective to reduce any leak current. An insulating film 18 is deposited on the PtSi film 1, thereby capping the PtSi film 1. The insulating film 18 is made of silicon oxide ($SiO_2$) formed by sputtering or the like. An ohmic contact 19 is formed in the p-type Si substrate 2, and a contact 20 is formed in electric contact with the PtSi film 1. A DC power supply 21 is connected between the ohmic contact 19 and the contact 20 for applying a DC voltage across the infrared sensor to maintain a positive potential at the PtSi film 1 for thereby keeping the infrared sensor reverse-biased. Since infrared radiations to be detected by the infrared sensor are generally weak in intensity, attempts have been made to increase the detection sensitivity as by utilizing the multiple reflection effect of hot carriers in the PtSi film 1.

FIG. 2 of the accompanying drawings is a potential diagram illustrative of operation principles of the conventional infrared sensor described above. Since the infrared sensor comprises a Schottky barrier diode, a depletion layer is created in the outermost surface and interior region of the outermost surface of the p-type Si substrate 2 which contacts the PtSi film 1. If not subjected to an image force, the Schottky barrier diode has a Schottky barrier height $\Phi b_0$ which is reduced quadratically in a transverse direction across the p-type Si substrate 2 according to the Poisson's equation. A potential in the absence of the image force is indicated by the broken-line curve 4 in FIG. 2. Actually, however, since a short-range force as the image force acts in the vicinity of a metal or a metal silicide, the Schottky barrier diode has a potential distribution indicated by the solid-line curve 5 in FIG. 2. The bottom of the potential distribution represents the position of an effective barrier which is located at a depth d from the Schottky junction interface, the effective barrier having a height $\Phi b_{effect}$. If the Schottky barrier diode has a junction interface between the p-type Si substrate 2 with a boron concentration of $5 \times 10^{14}$ $cm^{-2}$ and the PtSi film 1 and a reverse bias of 0 V is applied, then the depth d of the effective barrier from the junction interface is of about 10 nm, the Schottky barrier height $\Phi b_0$ is of 0.27 eV, and the effective barrier height $\Phi b_{effect}$ is of about 0.22 eV.

When an infrared radiation is applied to the Schottky barrier diode, the applied infrared radiation is absorbed mainly in the PtSi film 1, which generates hot holes. While there is a possibility for the hot holes to move in every direction, those of the hot holes moving toward the Si substrate 2 which satisfy given conditions at the position of the effective barrier further move into the Si substrate 2, and are detected as a signal charge when entering deeply in the Si substrate 2 along the forward electric field of the depletion layer. Stated otherwise, because hot holes are injected as excessive carriers into the p-type Si substrate, the applied infrared radiation can be detected by detecting the amount of the excessive carriers.

When hot holes 7 having an energy $E_0$ are generated in the PtSi film 1 in response to the application of an infrared radiation to the Schottky barrier diode, as shown in FIG. 2, some of the hot holes 7 reach the position of the effective barrier in the Si substrate 2. At this time, they lose part of their energy, and become hot holes 8 having an energy $E_1$. The momentum of hot holes has the same probability in every direction at all times because of the scattering effect at a shorter distance than the energy attenuation length. If the component of the momentum of a hot hole which is perpendicular to the barrier is greater than $\sqrt{2m^*\Phi b_{\text{effect}}}$ at the position of the effective barrier where $m^*$ is the effective mass of the hot hole, then the hot hole moves over the effective barrier and enters deeply into the Si substrate 2. Otherwise, the hot hole is reflected by the effective barrier. After being scattered and reflected, the reflected hot hole returns as an energy particle 9 having an energy $E_3$ back to the position of the effective barrier. Some of such energy particles move over the effective barrier as with the hot hole having the energy $E_1$.

The number of hot holes which move over the effective barrier increases through the above process. This process is referred to as the multiple reflection effect of hot holes, and is repeated until the energy of hot holes decreases to a level lower than an effective Schottky barrier energy $Eb_{\textit{effect}}$. To promote the multiple reflection effect, W. Kosonocky et al. have proposed to reduce the thickness t of the PtSi film to several nm to suppress the energy attenuation per reflection, and indicated the effects of the proposal. W. Kosonocky et al. have also indicated that if the quantum efficiency of the infrared sensor is represented by $Y^*$, the Planck's constant by h, the frequency of the infrared radiation by $\nu$, and a parameter derived from the potential distribution by $C1^*$, then the following equation is satisfied:

$$\sqrt{Y^*h\nu} = C1^*(h\nu - \Phi b_{\textit{effect}}) \quad (1)$$

W. Kosonocky et al. have ignored the attenuation of the energy of hot holes in the interval from the Schottky junction interface to the position of the effective barrier. While W. Kosonocky et al. have derived the above equation (1) based on the assumption of the equation:

$$h\nu \approx \Phi b_{\textit{effect}} \quad (2)$$

from an appropriate equation:

$$\sqrt{Y^*h\nu} = C^*(\sqrt{h\nu} - \sqrt{\Phi b_{\textit{effect}}}) \quad (3)$$

However, the precondition represented by the equation (2) is not correct, and hence the equation (1) is in error.

Nevertheless, the equation (1) is in general use because its error has gone unnoticed. For Schottky barrier infrared sensors proposed after the proposal by W. Kosonocky et al., their characteristics have been studied without any concern at all about the attenuation of the energy of hot holes in the interval from the Schottky junction interface to the position of the effective barrier. For example, Japanese Patent laid-open No. Hei-4-111467 (JP, A, 4-111467) discloses nothing about the distance d from the junction interface to the effective barrier position while a reference is made to the control of the effective barrier with the image force.

As described above, no considerations have heretofore been given to the attenuation of the energy of hot holes in the interval from the Schottky junction interface to the position of the effective barrier. In PtSi/Si Schottky barrier diodes, however, the distance d is large enough not to be neglected because it is of several nm, which also represent an optimum thickness for the PtSi film. Although the PtSi film should be sufficiently thick as it serves as a layer for absorbing applied infrared radiation, its thickness is selected to be of several nanometers to promote the multiple reflection effect. Consequently, in order to utilize the multiple reflection effect, it is necessary to take into account the distance d which is about the same as the thickness of the PtSi film. In the conventional Schottky barrier infrared sensors, the distance from the Schottky junction interface to the position of the effective barrier is large under the influence of the image force, and hence the energy which is lost by reflected hot carriers before they are injected into the Si substrate is so large that the sensitivity is not increased as much as expected according to the multiple reflection effect. It is important to reduce the distance d down to the effective barrier position for increasing the sensitivity of infrared detection because a reduction in the distance d can result in an increase in the sensitivity according to the multiple reflection effect.

SUMMARY OF THE INVENTION

It is an object of the present invention to provide a Schottky barrier infrared sensor which has a reduced distance from a Schottky junction interface to the position of an effective barrier for achieving an increase in the sensitivity of infrared detection according to the multiple reflection effect.

According to the present invention, the above object can be achieved by a Schottky barrier infrared sensor comprising a Schottky barrier diode composed of a first layer comprising a semiconductor of a first conductivity type and a second layer comprising a metal or a metal silicide, the first layer and the second layer being joined to each other, for detecting an incident infrared radiation based on the amount of excessive carriers generated in the first layer in response to passage of hot carriers through a depletion layer formed in the first layer in a position corresponding to a junction interface between the first layer and the second layer, said hot carriers being generated in the second layer by the incident infrared radiation, and a third layer disposed in the depletion layer formed in the first layer out of contact with the junction interface, the third layer containing an impurity which is introduced for positioning an effective barrier formed in the depletion layer under an image force, closely to the junction interface.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 3:
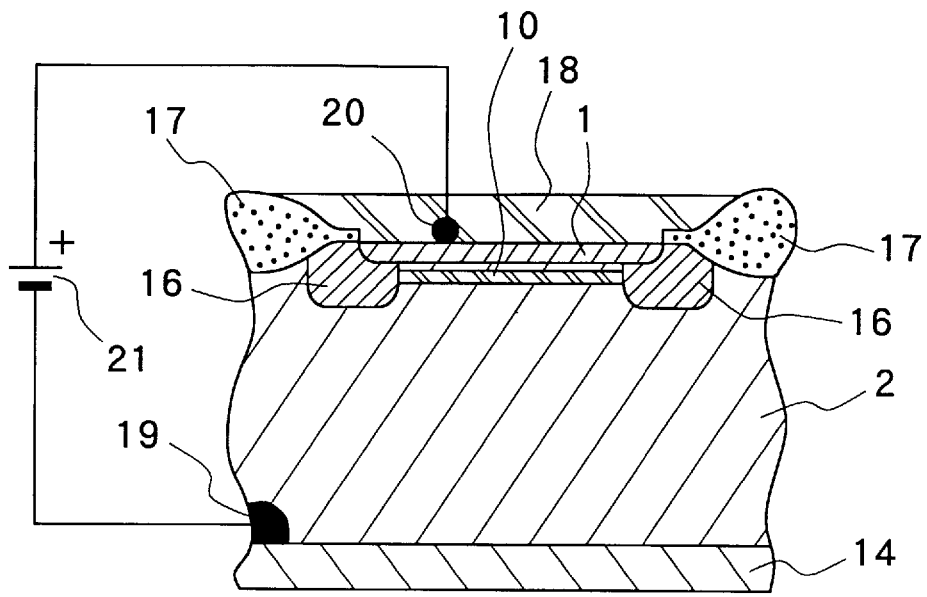
FIG. 3 is a fragmentary cross-sectional view of a Schottky barrier infrared sensor according to a first embodiment of the present invention.

FIG. 3 shows a Schottky barrier infrared sensor according to a first embodiment of the present invention. Those parts of the Schottky barrier infrared sensor shown in FIG. 3 which are identical to those of the conventional Schottky barrier infrared sensor shown in FIG. 1 are denoted by identical reference numerals.

Figure 1:
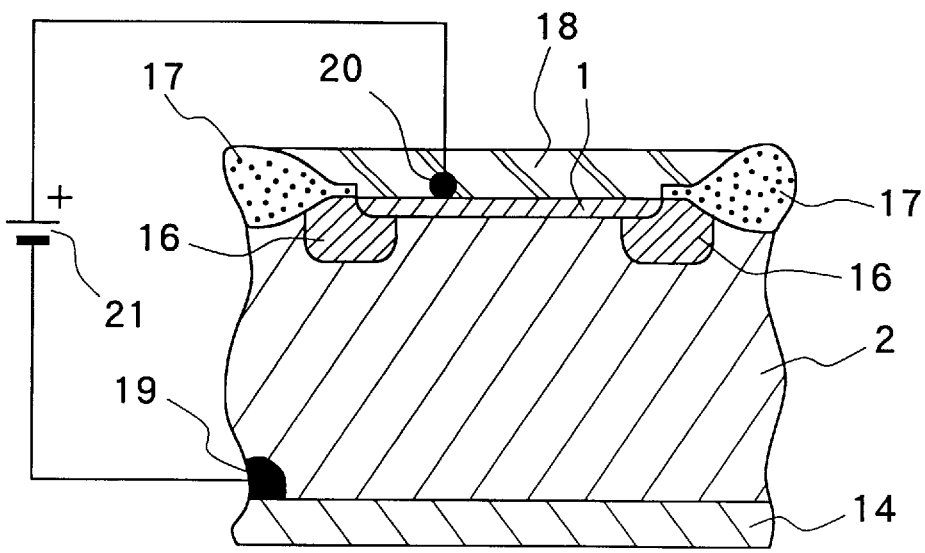
FIG. 1 is a fragmentary cross-sectional view of a conventional Schottky barrier infrared sensor.

The Schottky barrier infrared sensor shown in FIG. 3 differs from the conventional Schottky barrier infrared sensor shown in FIG. 1 in that a very thin n-type impurity-introduced layer 10 is formed in a depletion layer region of a Schottky diode in a p-type Si substrate 2. The n-type impurity-introduced layer 10 is disposed immediately below the Schottky junction interface of the p-type Si substrate 2 out of direct contact with the Schottky junction interface. Specifically, the n-type impurity-introduced layer 10 lies at a depth ranging from 1 nm to 5 nm from the Schottky junction interface. The n-type impurity-introduced layer 10 may be formed by molecular beam epitaxy (MBE) growth or delta (δ) doping techniques such as ion implantation.

Figure 4:
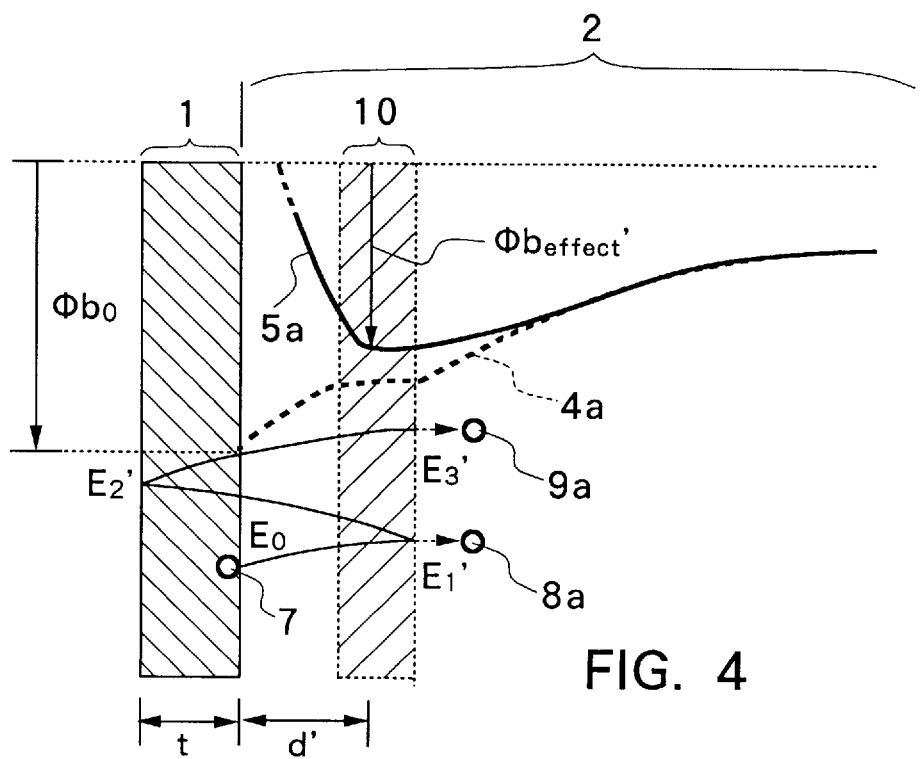
FIG. 4 is a potential diagram illustrative of operation principles of the Schottky barrier infrared sensor shown in FIG. 3.

FIG. 4 shows a potential distribution across the Schottky barrier infrared sensor shown in FIG. 3. In FIG. 4, the height of a Schottky barrier in the absence of the image force is represented by $\Phi b_0$, and a potential curve in the absence of the image force is represented by the broken line 4a. The height of an actual Schottky barrier in the presence of the image force is represented by $\Phi b_{effect}'$, and a potential curve in the presence of the image force is represented by the solid line 5a. The distance d' from the Schottky junction interface to the position of an effective barrier is smaller than the distance d in the conventional Schottky barrier infrared sensor shown in FIG. 3. The potential curve is relatively flat in the vicinity of the position of the effective barrier.

When hot holes 7 having an energy $E_0$ are generated in the PtSi film 1 in response to the incidence of an infrared radiation to the Schottky barrier diode, as shown in FIG. 4, some of the hot holes 7 reach the position of the effective barrier in the Si substrate 2, as hot holes 8a having an energy $E_1'$. Some of these hot holes 8a move over the effective barrier into the Si substrate 2. After being scattered and reflected, some of the hot holes which cannot move over the effective barrier reach the position of the effective barrier again as hot holes 9a having an energy $E_3'$. Some of the hot holes 9a move over the effective barrier into the Si substrate 2, thus increasing a signal charge.

If the energy attenuation constant of hot holes in the p-type Si substrate 2 is fixed irrespective of the impurity concentration in the substrate, then since the relationships: $E_1'>E_1$, $E_3'>E_3$ are satisfied by the reduction of the distance from the Schottky junction interface to the effective barrier position from d to d', the probability that hot holes move over the effective barrier is increased. Provided that the governing factor for determining the attenuation constant in the Si substrate 2 is phonon scattering, the assumption that the energy attenuation constant is fixed irrespective of the impurity concentration is appropriate. In the present embodiment, therefore, since the attenuation of the energy of hot holes is suppressed by reducing the distance from the Schottky junction interface to the effective barrier position, the number of hot holes moving over the effective barrier is increased, thereby increasing the sensitivity of infrared detection.

The difference between the impurity introduction according to the present embodiment and the interface impurity introduction for controlling the Schottky barrier height will be described below. According to the present invention, the impurity is introduced not for controlling the Schottky barrier height, but for controlling the position of the effective barrier. The Schottky barrier height is sensitive to the condition of the interface between a semiconductor (which is made of Si in the embodiment) and a metal (or a metal silicide). In the present embodiment, the impurity is introduced out of contact with the Schottky junction interface in order to achieve the same Schottky barrier height as if no impurity-introduced layer were formed in the depletion layer. According to the interface impurity introduction for controlling the Schottky barrier height, however, the impurity-introduced layer and the metal are directly joined to each other at the Schottky junction interface. In the infrared sensor disclosed in Japanese patent laid-open No. 63-237583, the degenerated semiconductor absorbs the incident infrared radiation, and the degenerated semiconductor and the potential barrier region, which corresponds to the impurity-introduced layer in the present embodiment, are directly joined to each other, unlike the infrared sensor in this embodiment.

Figure 5:
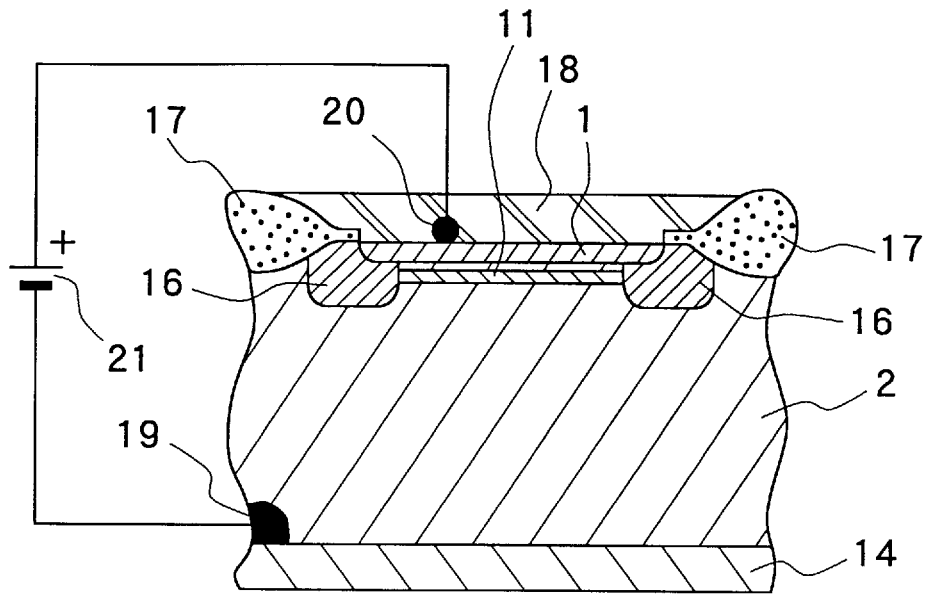
FIG. 5 is a fragmentary cross-sectional view of a Schottky barrier infrared sensor according to a second embodiment of the present invention.

FIG. 5 shows a Schottky barrier infrared sensor according to a second embodiment of the present invention. Those parts of the Schottky barrier infrared sensor shown in FIG. 5 which are identical to those of the Schottky barrier infrared sensor shown in FIG. 3 are denoted by identical reference numerals.

The Schottky barrier infrared sensor shown in FIG. 5 differs from the Schottky barrier infrared sensor shown in FIG. 3 in that a $p^+$ impurity-introduced layer 11 is employed in place of the n-type impurity-introduced layer. The $p^+$ impurity-introduced layer 11 is formed in a depletion layer region of a Schottky diode in a p-type Si substrate 2. The $p^+$ impurity-introduced layer 11 is disposed immediately below the Schottky junction interface of the p-type Si substrate 2 out of direct contact with the Schottky junction interface. Specifically, the $p^+$ impurity-introduced layer 11 lies at a depth ranging from 1 nm to 5 nm from the Schottky junction interface. The $p^+$ impurity-introduced layer 11 may be formed by molecular beam epitaxy (MBE) growth or delta doping techniques such as ion implantation.

Figure 2:
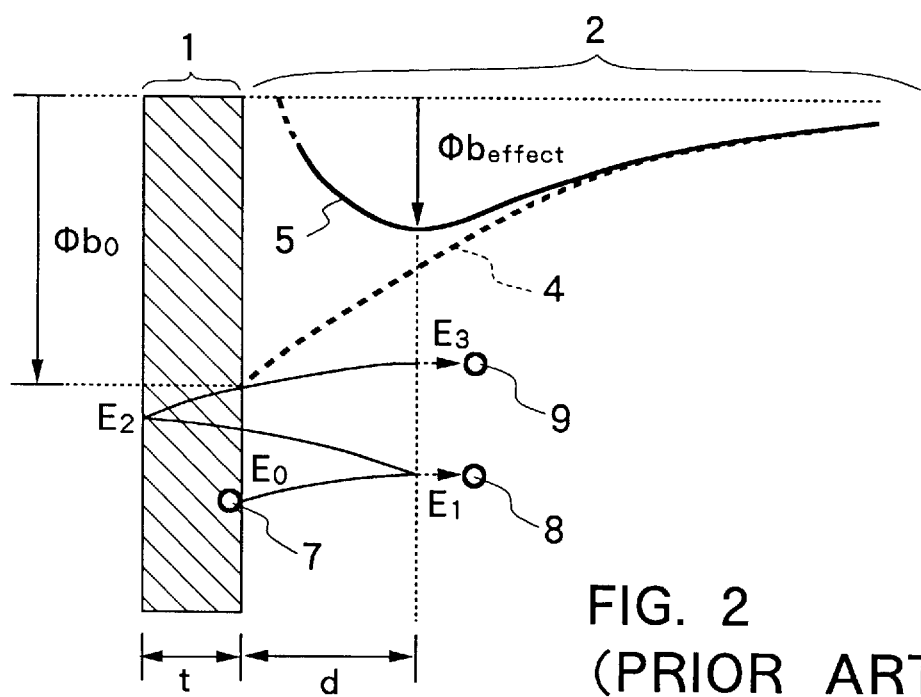
FIG. 2 is a potential diagram illustrative of operation principles of the Schottky barrier infrared sensor shown in FIG. 1.
Figure 6:
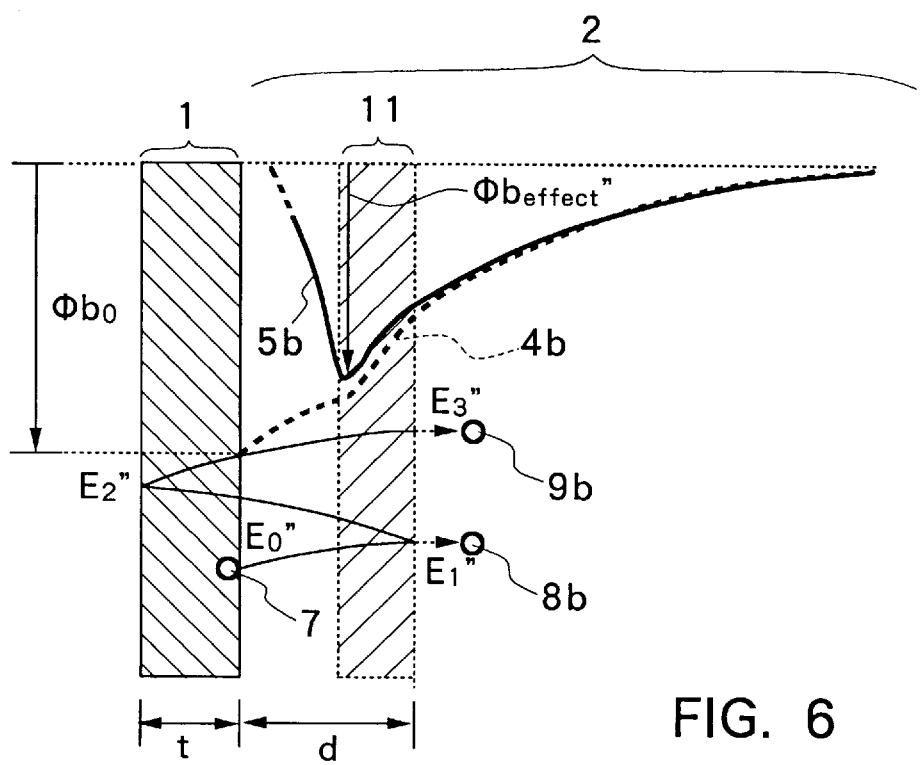
FIG. 6 is a potential diagram illustrative of operation principles of the Schottky barrier infrared sensor shown in FIG. 5.

FIG. 6 illustrates a potential distribution across the Schottky barrier infrared sensor shown in FIG. 5. In FIG. 6, the height of a Schottky barrier in the absence of the image force is represented by $\Phi b_0$, and a potential curve in the absence of the image force is represented by the broken line 4b. The height of an actual Schottky barrier in the presence of the image force is represented by $\Phi b_{effect}''$, and a potential curve in the presence of the image force is represented by the solid line 5b. The distance d" from the Schottky junction interface to the position of an effective barrier is smaller than the distance d in the conventional Schottky barrier infrared sensor shown in FIG. 3. The potential curve is steeper than the potential curve in FIG. 2 in the vicinity of the position of the effective barrier.

When hot holes 7 having an energy $E_0$ are generated in the PtSi film 1 in response to the incidence of an infrared radiation to the Schottky barrier diode, as shown in FIG. 6, some of the hot holes 7 reach the position of the effective barrier in the Si substrate 2, as hot holes 8b having an energy $E_2''$. Some of these hot holes 8b move over the effective barrier into the Si substrate 2. After being scattered and reflected, some of the hot holes which cannot move over the effective barrier reach the position of the effective barrier again as hot holes 9b having an energy $E_3''$. Some of the hot holes 9b move over the effective barrier into the Si substrate 2, thus increasing a signal charge. If the energy attenuation constant of hot holes in the p-type Si substrate 2 is fixed irrespective of the impurity concentration in the substrate, then since the relationships: $E_2''>E_2''$, $E_3''>E_3$ are satisfied by the reduction of the distance from the Schottky junction interface to the effective barrier position from d to d", the probability that hot holes move over the effective barrier is increased, resulting in an increase in the sensitivity of infrared detection.

The principles of the present invention are also applicable to general infrared sensors composed of a Schottky barrier diode which comprises a semiconductor and a metal or a metal silicide. For example, an n-type Si substrate may be used as a semiconductor substrate, and hot electrons may be employed as hot carriers. Semiconductors other than silicon may also be used. A metal or a metal silicide for forming a Schottky junction is selected depending on the semiconductor used and the desired wavelength to be detected.

Although certain preferred embodiments of the present invention have been shown and described in detail, it should be understood that various changes and modifications may be made therein without departing from the scope of the appended claims.

What is claimed is:

1. A Schottky barrier infrared sensor comprising:
   a first layer of a first conductivity type;
   a second layer of one of metal and metal silicide;
   a guard ring layer of a second conductivity type embedded in said first layer to a predetermined depth and encircling said second layer, said first layer and said second layer being joined to each other at a junction interface for detecting incident infrared radiation,
   wherein the detecting of the incident infrared radiation is based on the amount of excessive carriers generated in said first layer in response to passage of hot carriers through a depletion layer, said depletion layer being formed in said first layer in a position which is immediately adjacent said junction interface and surrounded by said guard ring layer, said hot carriers being generated in said second layer by the incident infrared radiation; and
   a third layer disposed in the depletion layer at a depth less than said predetermined depth and out of contact with said junction interface, said third layer containing an impurity which is introduced for positioning an effective barrier in said depletion layer.

2. The Schottky barrier infrared sensor according to claim 1, wherein said third layer disposed in the depletion layer formed in said first layer is at a distance not less than 1 nm and not greater than 5 nm from said junction interface.

3. A Schottky barrier infrared sensor comprising:
   a first layer of a first conductivity type;
   a second layer of one of metal and metal silicide;
   a guard ring layer of a second conductivity type embedded in said first layer to a predetermined depth and encircling said second layer, said first layer and said second layer being joined to each other at a junction interface for detecting an incident infrared radiation,
   wherein the detecting of the incident infrared radiation is based on the amount of excessive carriers generated in said first layer in response to passage of hot carriers through a depletion layer, said depletion layer being formed in said first layer in a position which is immediately adjacent said junction interface and surrounded by said guard ring layer, said hot carriers being generated in said second layer by the incident infrared radiation; and
   a third layer disposed in the depletion layer at a depth less than said predetermined depth and out of contact with said junction interface, said third layer containing an impurity of a conductivity type different from said first conductivity type, which is introduced for positioning an effective barrier in said depletion layer,
   wherein a potential curve is relatively flat in the vicinity of said effective barrier.

4. The Schottky barrier infrared sensor according to claim 3, wherein said infrared radiation is applied to said junction interface from a side of said second layer.

5. The Schottky barrier infrared sensor according to claim 4, further comprising an anti-reflection film disposed on a surface of said second layer remote from said junction interface.

6. The Schottky barrier infrared sensor according to claim 3, wherein said first layer comprises a p-type silicon layer, and said second layer comprises a platinum silicide layer.

7. The Schottky barrier infrared sensor according to claim 3, wherein said third layer disposed in the depletion layer formed in said first layer is at a distance not less than 1 nm and not greater than 5 nm from said junction interface.

8. A Schottky barrier infrared sensor comprising:
   a first layer of a first conductivity type;
   a second layer of one of metal and metal silicide;
   a guard ring layer of a second conductivity type embedded in said first layer to a predetermined depth and encircling said second layer, said first layer and said second layer being joined to each other at a junction interface for detecting an incident infrared radiation,
   wherein the detecting of the incident infrared radiation is based on the amount of excessive carriers generated in said first layer in response to passage of hot carriers through a depletion layer, said depletion layer being formed in said first layer in a position which is immediately adjacent said junction interface and surrounded by said guard ring layer, said hot carriers being generated in said second layer by the incident infrared radiation; and
   a third layer disposed in the depletion layer at a depth less than said predetermined depth and out of contact with said junction interface, said third layer containing an impurity of said first conductivity type, which is introduced for positioning an effective barrier in said depletion layer.

9. The Schottky barrier infrared sensor according to claim 8, wherein said infrared radiation is applied to said junction interface from a side of said second layer.

10. The Schottky barrier infrared sensor according to claim 7, further comprising an anti-reflection film disposed on a surface of said second layer remote from said junction interface.

11. The Schottky barrier infrared sensor according to claim 8, wherein said first layer comprises a p-type silicon layer, and said second layer comprises a platinum silicide layer.

12. The Schottky barrier infrared sensor according to claim 8, wherein said third layer disposed in the depletion layer formed in said first layer is at a distance not less than 1 nm and not greater than 5 nm from said junction interface.

13. A Schottky barrier infrared sensor comprising:
   a first layer of a first conductivity type;
   a second layer including one of a metal and a metal silicide which is joined to said first layer;
   a guard ring embedded in said first layer to a predetermined depth, said guard ring surrounding a depletion layer in said first layer, said depletion layer being in a position adjacent a junction interface between said first and second layers, thereby detecting incident infrared radiation based on the amount of excessive carriers generated in said first layer in response to passage of hot carriers through said depletion layer, said hot carriers being generated in said second layer by the incident infrared radiation; and a third layer disposed in the depletion layer at a depth less than said predetermined depth and out of contact with said junction interface, said third layer containing an impurity which is introduced for positioning an effective barrier in said depletion layer.

* * * * *

UNITED STATES PATENT AND TRADEMARK OFFICE
CERTIFICATE OF CORRECTION

PATENT NO. : 5,814,873
DATED : September 29, 1998
INVENTOR(S) : Kazuo KONUMA

It is certified that error appears in the above-indentified patent and that said Letters Patent is hereby corrected as shown below:

Item [63] title page; delete "699,821" and insert --669,821--.

Column 5, line 46, delete "$E_1'$" and insert --$E_1$--. (second occurrence)

Column 6, line 57, delete "$E_2''$" and insert --$E_1''$--; and

Column 6, line 66, delete "$E_2'' > E_2'''$" and insert --$E_1'' > E_1'''$--.

Signed and Sealed this

Nineteenth Day of October, 1999

Q. TODD DICKINSON

Attest:

Attesting Officer

Acting Commissioner of Patents and Trademarks